(12) United States Patent
Tanimura et al.

(10) Patent No.: US 6,441,312 B1
(45) Date of Patent: Aug. 27, 2002

(54) ELECTRONIC PACKAGE WITH PLURALITY OF SOLDER-APPLIED AREAS PROVIDING HEAT TRANSFER

(75) Inventors: Hirotoshi Tanimura, Kusatsu; Keiichi Ohtsubo, Shiga-ken; Shinji Ueno, Suita, all of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/892,004

(22) Filed: Jun. 26, 2001

(30) Foreign Application Priority Data

Jun. 30, 2000 (JP) ........................................ 2000-199768

(51) Int. Cl.[7] ................................................. H05K 1/00
(52) U.S. Cl. ........................ 174/252; 174/260; 361/715; 361/720; 361/692; 361/693; 361/764; 361/707; 361/708
(58) Field of Search ................................ 174/52.1, 252, 174/260; 361/715, 719, 720, 692, 693, 707, 708, 764

(56) References Cited

U.S. PATENT DOCUMENTS

| | | | | |
|---|---|---|---|---|
| 4,839,774 A | * | 6/1989 | Hamburgen | 361/693 |
| 5,012,387 A | * | 4/1991 | Ohlenburger | 361/708 |
| 5,708,566 A | * | 1/1998 | Hunninghaus et al. | 361/764 |

* cited by examiner

Primary Examiner—Hung V. Ngo
(74) Attorney, Agent, or Firm—Lawrence R. Fraley

(57) ABSTRACT

An electronic package in which an electronic component (e.g., LSI chip module) includes a heat dissipating surface (e.g., metal layer) and is positioned on a printed wiring board such that the heat dissipating surface is located adjacent a heat transfer area on the board. The heat transfer area is in the form of a pattern of solder-applied areas from which the solder bonds to the heat dissipating layer to provide heat transfer from the component to the board. Through holes may also be used in the board to increase heat removal.

15 Claims, 9 Drawing Sheets

ELECTRONIC PACKAGE WITH PLURALITY OF SOLDER-APPLIED AREAS PROVIDING HEAT TRANSFER

TECHNICAL FIELD

The present invention relates to electronic packages including a printed wiring board and an electronic component mounted on the board. More particularly, the invention relates to such packages wherein some form of heat transference is utilized to effectively remove heat generated by the component.

BACKGROUND OF THE INVENTION

As operating speeds and performance of various electronic components such as large scale integrated (LSI) circuit packages increase, these components generate a larger amount of heat. Furthermore, with an increase in packaging density of such components, the temperature of the printed wiring board on which these are positioned also tends to increase. Therefore, the heat control of such components and boards has become increasingly important. One important point in controlling heat transfer is how to dissipate heat from the component to a printed wiring board. Important factors in this heat control include: (1) how to dissipate heat from the component itself; (2) how to dissipate heat from the printed wiring board; and (3) how to mount the component close together on the printed wiring board to effectively conduct heat from the components to the board.

Conventionally, in order to promote heat dissipation from a component such as an LSI circuit module, a metallic part 2 may be located in an LSI component 1, and a heat transfer surface 3a of a printed wiring board 3 joined to part 2 with solder 4 (as shown in FIG. 11). As such, the board 3 in effect functions as a heat sink for the component. The transferred heat is dissipated to the outside (of board 3) through plated through holes (PTHs) 5 formed in the wiring board 3, or may also be transferred to a ground layer 6 and a power supply layer 7 inside the wiring board 3 for eventual external dissipation.

In the aforementioned conventional technique, the heat transfer surface 3a of board 3 is generally a flat metal layer and solder paste is applied to all over the surface 3a including the PTHs 5. The applied solder paste is then reflowed to fix the LSI component to the board. However, during the reflowing process of this known technique, some of the solder paste may flow into the PTHs 5, whereby solder-filled spaces 9 and empty spaces 8 are formed between package 1 and the heat transfer surface 3a. See FIG. 12. In this case, heat can be dissipated from the solder-filled spaces 9 to the outside through board 3 by heat conduction, but heat can be hardly dissipated from the empty spaces 8 because spaces 8 thermally insulate package 1 from surface 3a. For this reason, the temperature of the package increases, which leads to a reduction of the operating speed of the package. Therefore, in this technique, heat generated from package 1 is controlled by ensuring a minimum solder area, focusing on the total amount of heat to be transferred through the solder. However, as seen, the package is not uniformly soldered to surface 3a such that the heat is only locally concentrated and efficient heat dissipation cannot be predicted.

When empty spaces 8 are formed between the package's bottom surface and the heat transfer surface 3a on printed wiring board 3, flux residues also tend to be left in these spaces. Such flux residues are oxidized and thereby can attack (harm) the package and the reliability of the semiconductor device(s) used therein.

SUMMARY OF THE INVENTION

A primary object of the present invention is to join a heat dissipation surface of an electronic component evenly to a heat transfer surface of a printed wiring board to achieve maximized, efficient heat dissipation.

A more particular object of the present invention is to join a heat dissipation surface of an electronic component closely together with a heat transfer surface of a printed wiring board in such a manner so as not to form enclosed empty spaces therebetween.

According to one aspect of the invention, there is provided an electronic package comprising a printed wiring board, an electronic component mounted on the printed wiring board and including a heat dissipating surface, a heat transfer surface located on the printed wiring board and positioned directly beneath the electronic component for receiving heat generated by the electronic component, the heat transfer surface being thermally bonded to the heat dissipating surface and including a plurality of solder-applied areas spaced separately from one another on the heat transfer surface.

According to another aspect of the invention, there is provided an electronic package comprising a printed wiring board including at least one internal conductive layer, an electronic component mounted on the printed wiring board and including a heat dissipating surface, a heat transfer surface located on the printed wiring board and positioned directly beneath the electronic component for receiving heat generated by the electronic component, the heat transfer surface being thermally bonded to the heat dissipating surface and including a plurality of solder-applied areas spaced separately from one another on the heat transfer surface, the heat transfer surface further including a plurality of through holes therein, at least one of the through holes being thermally coupled to the at least one internal conductive layer such that the internal conductive layer will provide a path for heat transfer during package operation.

According to still another aspect of this invention, there is provided an electronic package comprising a printed wiring board, an electronic component mounted on the printed wiring board and including a heat dissipating surface and a heat transfer surface located on the printed wiring board and positioned directly beneath the electronic component for receiving heat generated by the electronic component, the heat transfer surface being thermally bonded to the heat dissipating surface and including a plurality of solder-applied areas arranged in a pattern and spaced separately from one another on the heat transfer surface, some of the solder-applied areas being larger in area than others of said solder-applied areas.

In the present invention, a plurality of separate solder-applied areas are formed on the heat transfer surface to dissipate heat from the electronic component to the printed wiring board. The respective solder-applied areas reliably join the electronic component to the wiring board, so that stable and uniform heat dissipation and reliable solder bonding can be achieved without causing uneven soldering.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals are used to indicate like elements from FIG. To FIG.

Embodiments of the present invention will be hereinafter described with reference to the accompanying drawings.

Figure 1:
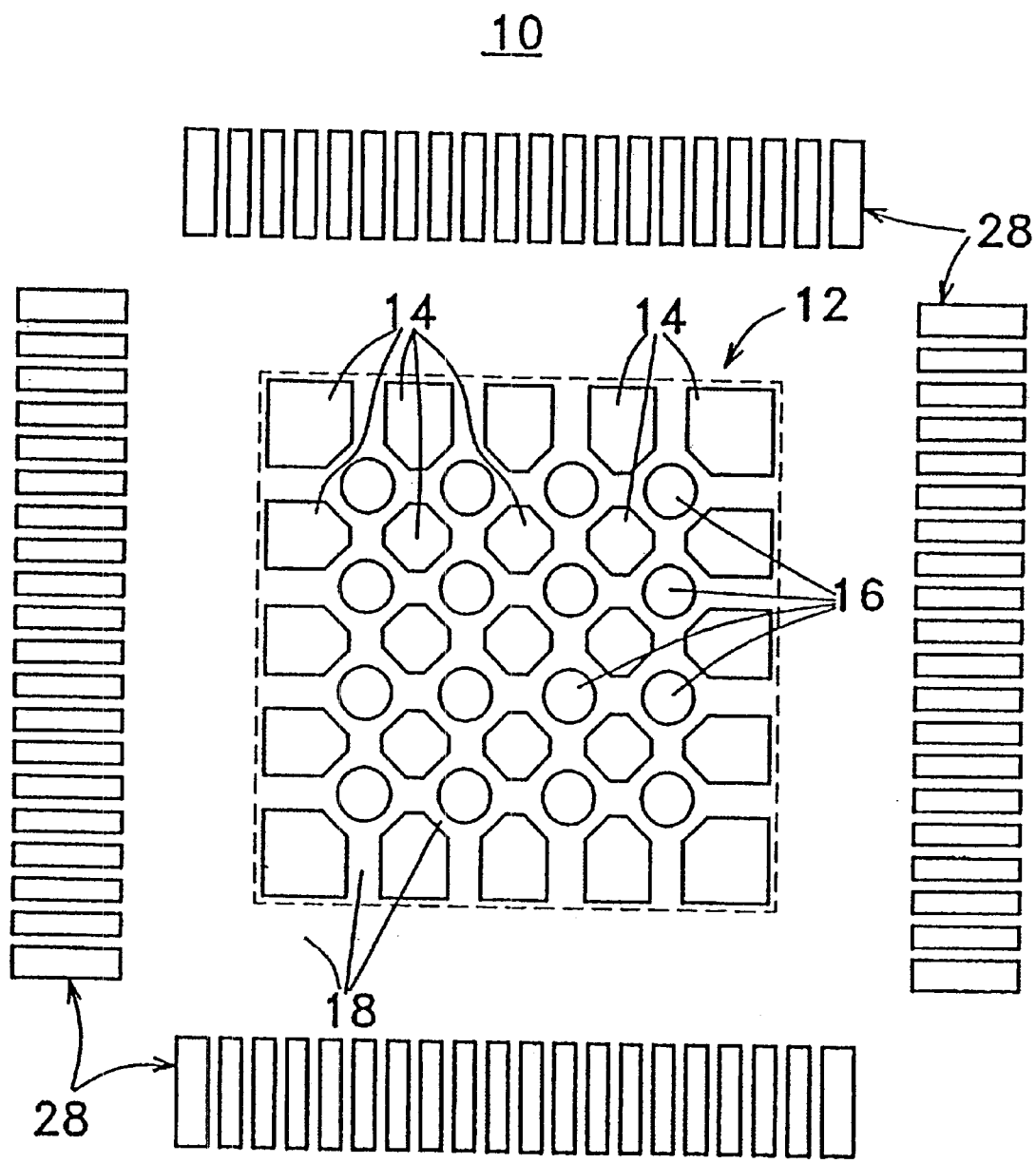
FIG. 1 is an enlarged plan view showing a portion of the upper surface of a printed wiring board according to one embodiment of the present invention.
Figure 2:
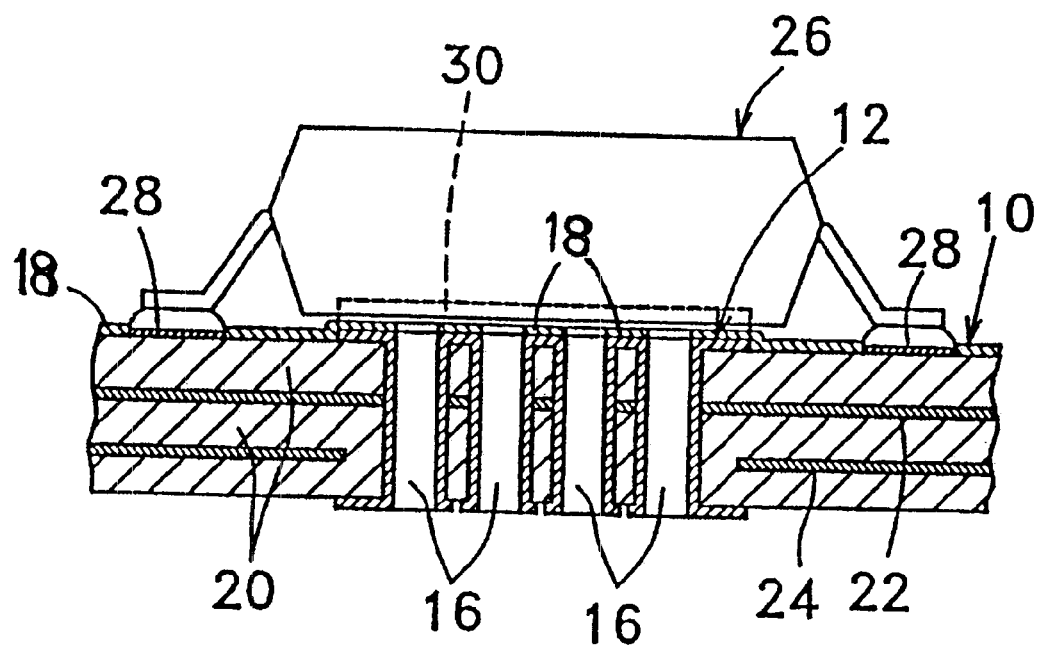
FIG. 2 is a side elevational view, in section, showing an electronic component mounted on the printed wiring board shown in FIG. 1, according to the teachings of the invention.

FIGS. 1 and 2 are enlarged views showing a major part of one embodiment of a printed wiring board 10 for use in the present invention. Printed wiring board 10, on which an electronic component 26 is mounted to form the electronic package of this invention, comprises a heat transfer surface 12 for transferring heat from component 26, a plurality of solder-applied areas 14 formed separately on surface 12, and a plurality of heat conducting through holes (e.g., PTHs) formed in board 10 and passing through surface 12. In addition, a solder resist dam 18 having a width wide enough to prevent molten solder from flowing externally from the pattern of areas 14 is formed around the solder-applied areas and the openings of heat conducting through holes 16.

Printed wiring board 10 may be a single layer board, but is preferably a multilayer board composed of a plurality of internal conductive layers, e.g., a ground layer 22 and a power layer 24. Glass fiber-reinforced epoxy 20 serves as the dielectric material. A wiring pattern including an external pattern of electrodes 28 for mounting component 26 thereon (e.g., by soldering or wirebonding) is formed on the upper surface of board 10. In addition, through holes 16 and photo-vias (not shown), are preferably formed to establish electrical connection with ground layer 22 and power layer 24, respectively inside board 10. As stated, through holes 16 also provide paths for heat dissipation externally of board 10.

Heat (and electrical) conducting through holes 16 are formed in the heat transfer surface 12 of printed wiring board 10, which surface 12, as shown, is placed close to a heat dissipation surface 30 of electronic component 26 when the component is mounted on the board. Through holes 16 are preferably formed by drilling through heat transfer surface 12 and then plating the inner walls of the drilled holes with copper or the like conductive material. The surface of board 10 is also plated at the same time to provide the desired circuit pattern. Understandably, heat generated by electronic component 26 is transferred to heat transfer surface 12 and then passes through holes 16 to ground layer 22 and power layer 24, which each function as a heat sink. The heat is also dissipated to the outside of board 10 from the lower ends of the through holes.

Figure 3:
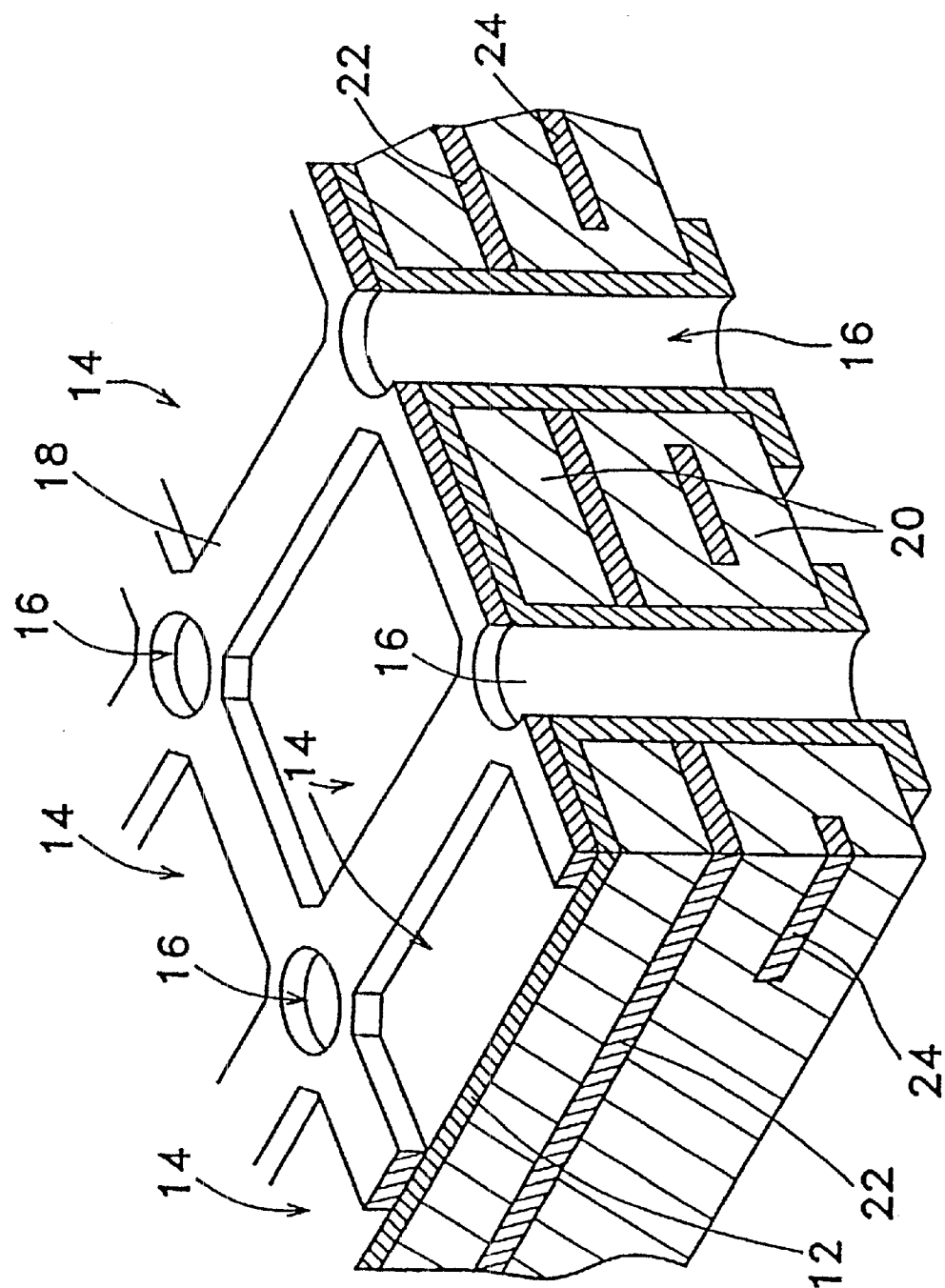
FIG. 3 is a much enlarged, partial perspective view showing a portion of the printed wiring board shown in FIG. 1.

The heat transfer surface 12 of board 10 is substantially as large as the heat dissipation surface 30 of electronic component 26, and both of these surfaces are substantially flat (except of course for the portions in surface 12 where through holes 16 are formed). Surface 12 is formed of a patterned metal (such as copper) having excellent adhesion to solder. After surface 12 is formed, solder resist 18 is applied to the surface of the printed wiring board 10 except for the electrodes 28. At this time, solder resist 18 is also applied to the heat transfer surface 12 to define the areas 14 to be soldered, as shown in FIG. 3. A conventional solder resist can be used and applied in a conventional matter, further description not believed needed.

The exposed solder areas 14 are defined by solder resist 18, as seen in FIG. 3. As stated, resist 18 also acts as a solder dam. Solder resist 18 has a width wide enough to prevent molten solder from flowing out of areas 14 and, as stated, is formed to substantially surround both areas 14 and through holes 16. After resist application, solder paste is applied to exposed areas 14 to thereby form solder-applied areas. The solder is applied to substantially the same height as the surrounding solder resist 18. The term "separate areas" used herein means that neighboring areas are physically isolated from each other so that the solder paste applied to the areas 14 and the reflowed solder therefrom are confined to these areas. In addition, the term "solder resist dam" as used herein means that the solder resist has a width wide enough to prevent molten solder from neighboring areas from contacting one another. As known, solder resist paste is a material having no solderability. As seen in FIGS. 2 and 3, the resist material surrounds each through hole 16 and area 14. The most preferred method to apply solder paste to separate areas 14 is screen printing but other conventional means are possible.

The thus-produced printed wiring board 10 is positioned within suitable mounting equipment (e.g., pick and place apparatus), and the electronic component 26 is soldered to board 10 by reflowing the screened-on solder paste. During this solder reflow process, while the solder paste applied to areas 14 is heated, the molten solder does not flow into other areas and the through holes, but does bond, uniformly (at each area location), with the heat transfer surface 30 of electronic component 26. Therefore, since a uniform solder joint is obtained between component and board, a product having stable heat dissipation and reliable adhesive properties is assured (including without the need for verification through X rays).

As stated, the heat dissipation surface 30 of electronic component 26 is joined by solder to the heat transfer surface 12 of printed wiring board 10. It is understood from the description herein that the resulting solder pattern for the solder interconnecting board 10 and component 26 will be similar to that of the solder-applied areas defined above and as seen in the drawings. For example, the solder pattern for the interconnection of the product in FIG. 1 will include 25 distinct areas of solder for each of the areas 14. There will be no solder above the respective through hole 16 locations nor where solder resist 18 is located. As a consequence, the heat generated from the electronic component 26 can be substantially evenly dissipated so that the reliability of component 26 is improved over earlier forms of heat transfer. In addition, the electronic component is secured to board 10 with sufficient bonding strength of the type shown in the prior art structures (e.g., FIG. 12). Moreover, since no empty (open) spaces (gaps, voids, etc.) are formed within this solder layer between heat dissipation surface 30 and heat transfer surface 12, except for those occupied by the through holes that pass through the board and thus are exposed to the exterior of the board, the electronic component is prevented from deterioration due to oxidation of captured solder flux residues as mentioned above. The result is a sturdier product with an improved operating life.

Figure 4:
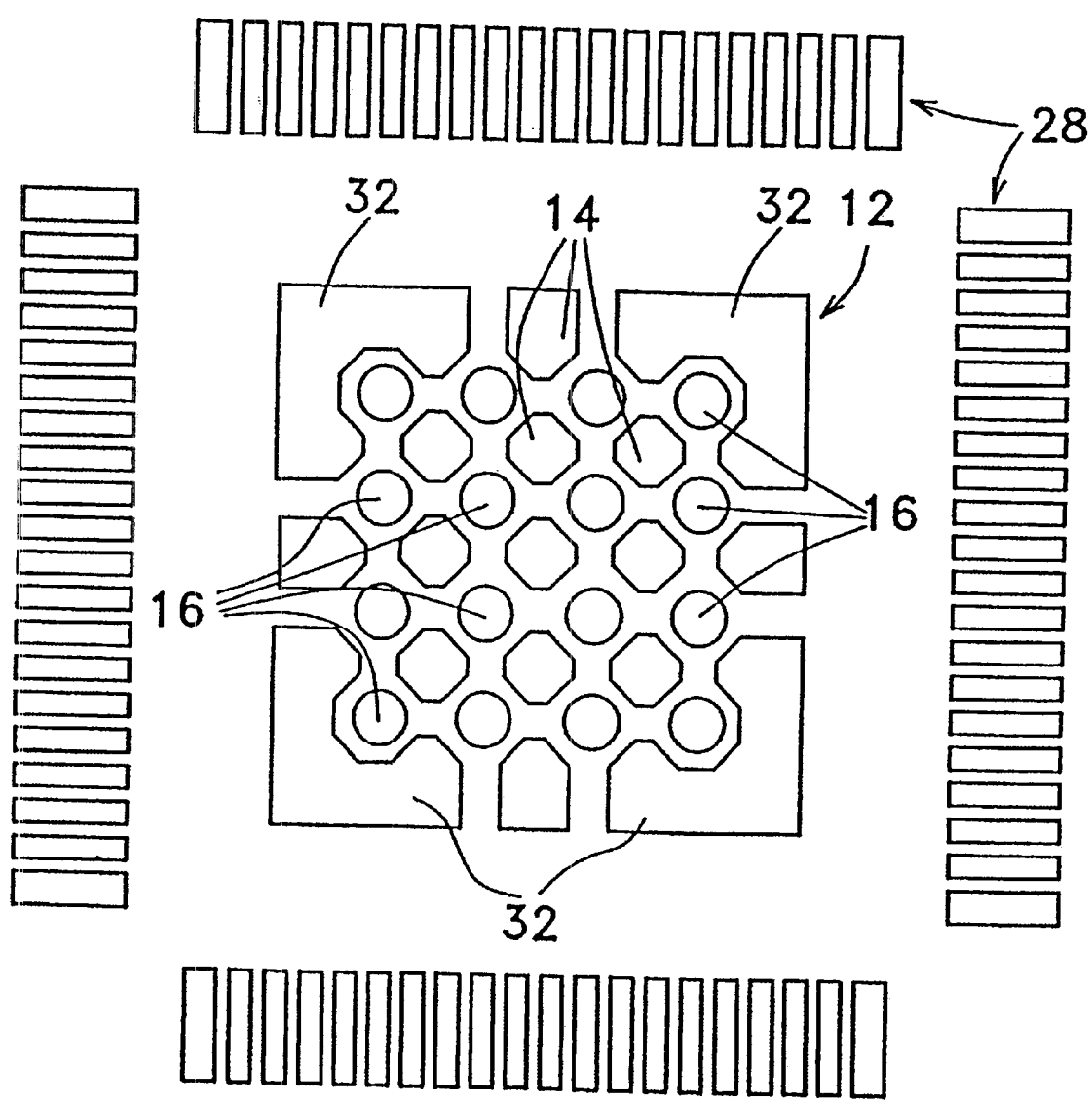
FIG. 4 is an enlarged plan view showing a portion of the upper surface of a printed wiring board according to another embodiment of the present invention.
Figure 5:
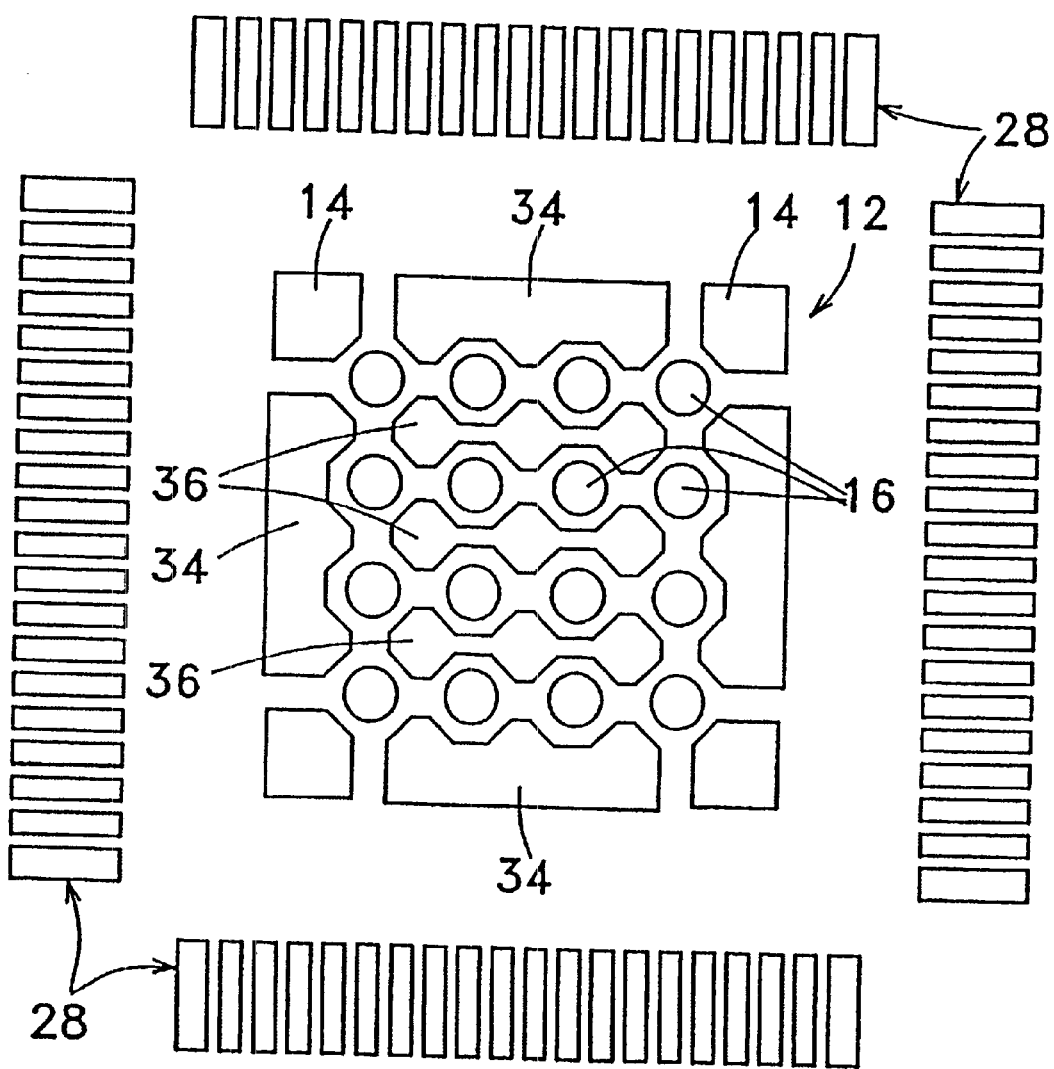
FIG. 5 is an enlarged plan view of a portion of the upper surface of a printed wiring board according to still another embodiment of the present invention.
Figure 6:
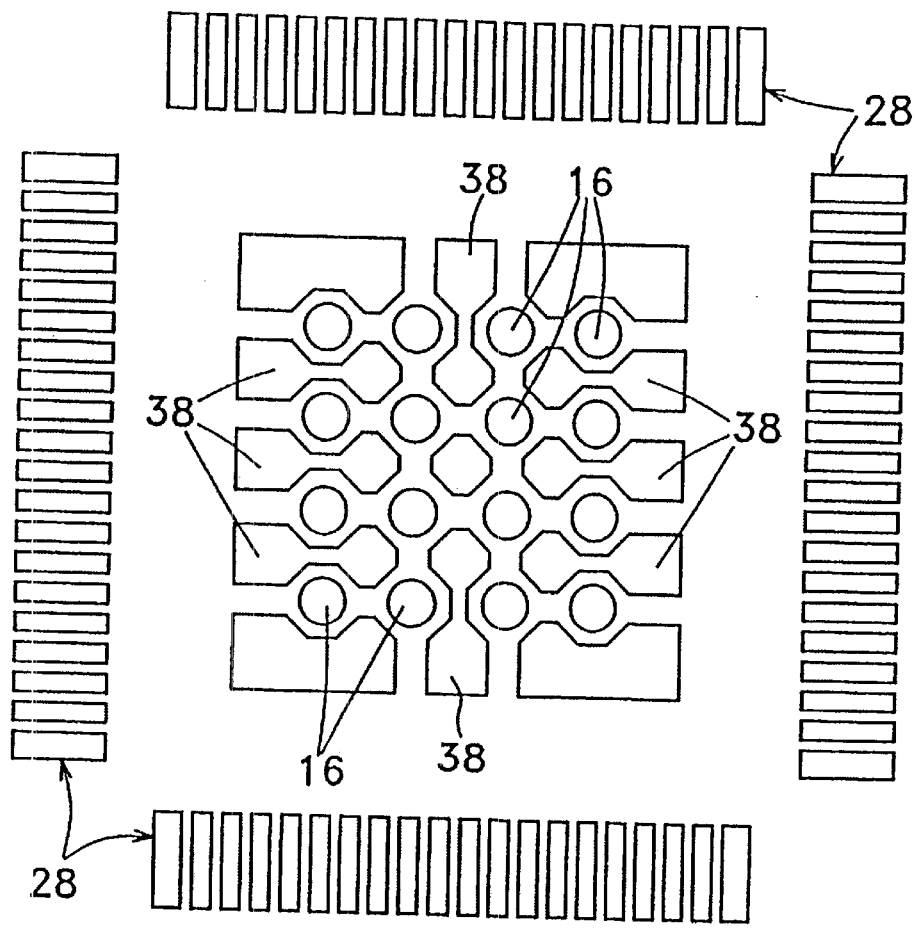
FIG. 6 is an enlarged plan view of a portion of the upper surface of a printed wiring board according to yet another embodiment of the present invention.

The electronic package of the present invention is not limited to the above embodiment. For example, as shown in FIG. 4, the solder-applied areas on four corners of heat transfer surface 12 can be expanded in size to form relatively large solder-applied areas 32 at these corners. Alternatively, as shown in FIG. 5, the solder-applied areas on the four sides of surface 12 can be expanded in size to form relatively large solder-applied areas 34 along the sides. Still further, the solder-applied areas in the center portion of surface 12 can be expanded to form relatively large solder-applied areas 36 (three in FIG. 5). Even further, as shown in FIG. 6, the solder-applied areas on the four sides of surface 12 can be combined with the solder-applied areas in the center of surface 12 to form relatively large solder-applied areas 38. As described above, the formation of relatively large solder-applied areas 32, 34, 36, and 38 can expand the bonding and heat transfer areas between the heat dissipation surface 30 of the electronic component 26 and the heat transfer surface 12 of printed wiring board 10. It is thus possible to "tailor" these patterns depending on the necessary rate of heat removal from component 26.

It should also be understood that the shapes, positions, and sizes of the various solder-applied areas may vary depending on the size and shape of heat transfer surface 12 and/or the number, position, and size of the through holes 16. In all of these configurations, it is understood that the aforedefined solder resist dam is preferably utilized and surrounds the areas and the through holes. Further, it is seen in FIGS. 1 and 4–6 that each of the solder-applied areas 10 is larger in size than the area taken by each of the adjacent through holes and, in some situations (i.e., FIGS. 4-6), are several times larger. Notably, both small and large size areas are utilized in some embodiments.

In the embodiments shown in FIGS. 4, 5 and 6, the ratio of solder-applied areas to openings varies, from 17:16 (FIG. 4) to 11:16 (FIG. 5). (FIG. 6 has a 13:16 ratio.) Therefore, there may be more or less solder-applied areas compared to the corresponding number of through holes. (Note that in FIG. 1, 25 areas are taught, compared to 16 through holes.)

As stated, in the aforementioned embodiments, the solder resist dam is formed to surround the solder-applied areas and the through holes so that molten solder does not flow into other neighboring areas and the through holes during reflow. However, as shown in FIG. 7, if these through holes (or photo-vias) are previously filled with solder or other metals, or when the printed wiring board does not include any through holes (or photo-vias) or only includes shallow (in depth) photo-vias, there is no need to form the solder resist dam around these through holes or photo-vias.

Figure 7:
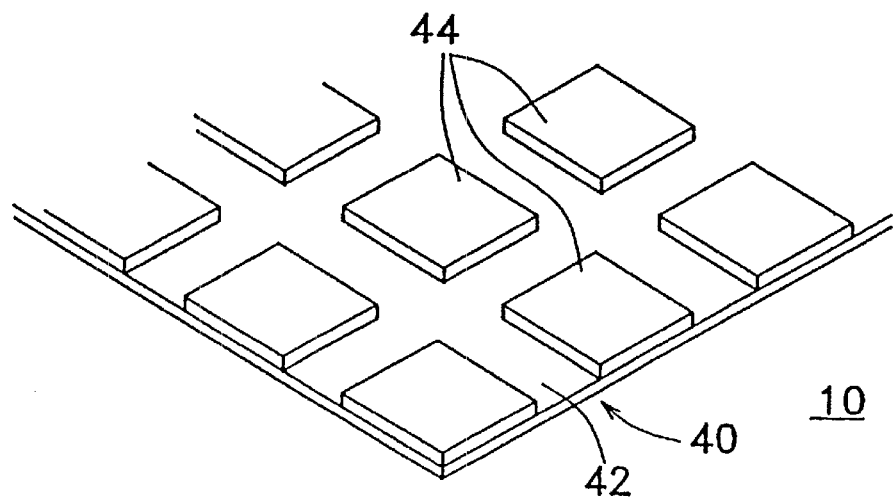
FIG. 7 is an enlarged, partial perspective view showing another embodiment of a printed wiring board for use in the present invention.

Alternatively, when heat transfer surface 40 of printed wiring board 10 comprises a solid metal layer 42 made of copper or the like, solder paste may be screen printed on the layer 42 with equal spacing to form separate solder-applied areas 44 as shown in FIG. 7. In this embodiment, although no solder resist dam is formed to prevent solder paste from flowing, the molten solder will keep a uniform shape by surface tension. Therefore, neighboring solder-applied areas will not be combined during reflow unless very close to one another.

Figure 8:
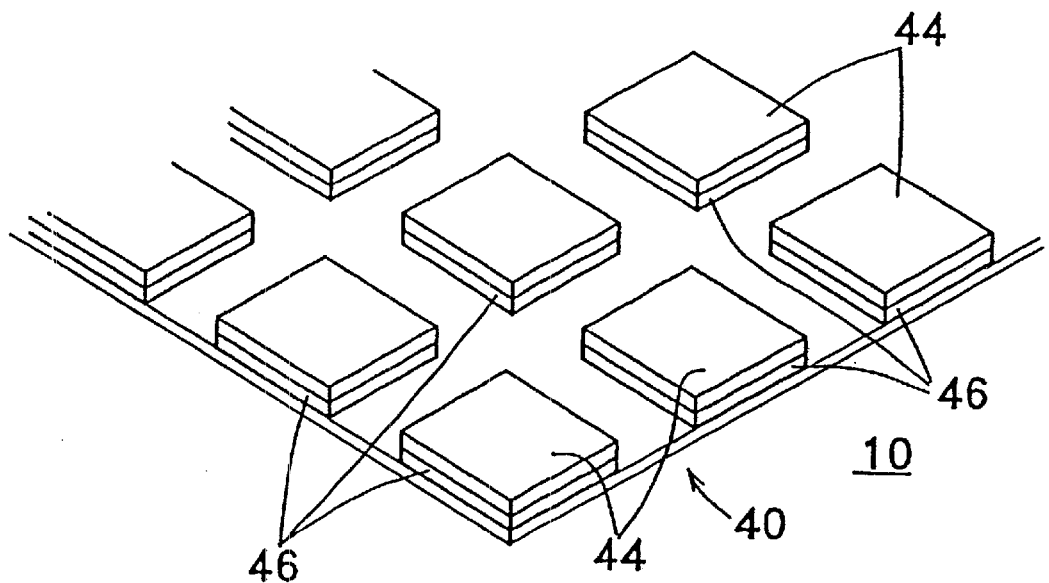
FIG. 8 is an enlarged, partial perspective view showing a part of a still further embodiment of a printed wiring board for use in the present invention.

Furthermore, heat transfer surface 40 may comprise a plurality of spaced metal layer "pads" 46, e.g., formed on a dielectric surface, which are of an equal number to the corresponding number of solder-applied areas 44, as seen in FIG. 8. In this case, if a solder resist dam is not formed between the solder-applied areas 44, the molten solder paste on the neighboring areas can be prevented from combining with paste on one area so that the same effect as described above can be achieved. This, too, depends on the relative spacing between pads 46. In this embodiment, metal layer pads 46 should be formed on a non-solder wettable insulating layer to further prevent the solder paste on the neighboring areas 44 from combining with each other.

Figure 9:
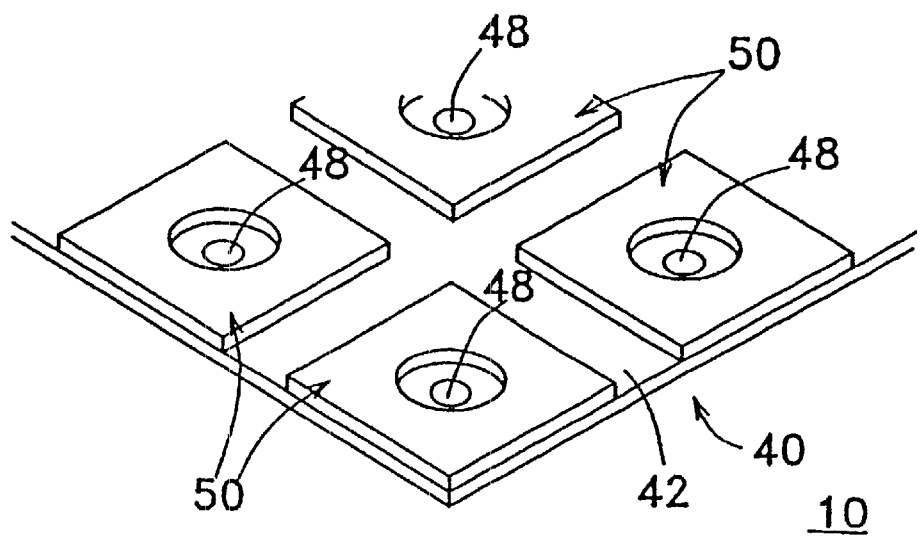
FIG. 9 is an enlarged, partial perspective view showing a part of a further embodiment of a printed wiring board for use in the present invention.

Furthermore, as shown in FIG. 9, it is also possible that the solder paste be screen printed on the single, solid metal layer 42 to define a plurality of solder-applied areas 50, which are spaced apart from each other and, significantly, which surround respective through holes 48.

EXAMPLE

Figure 12:
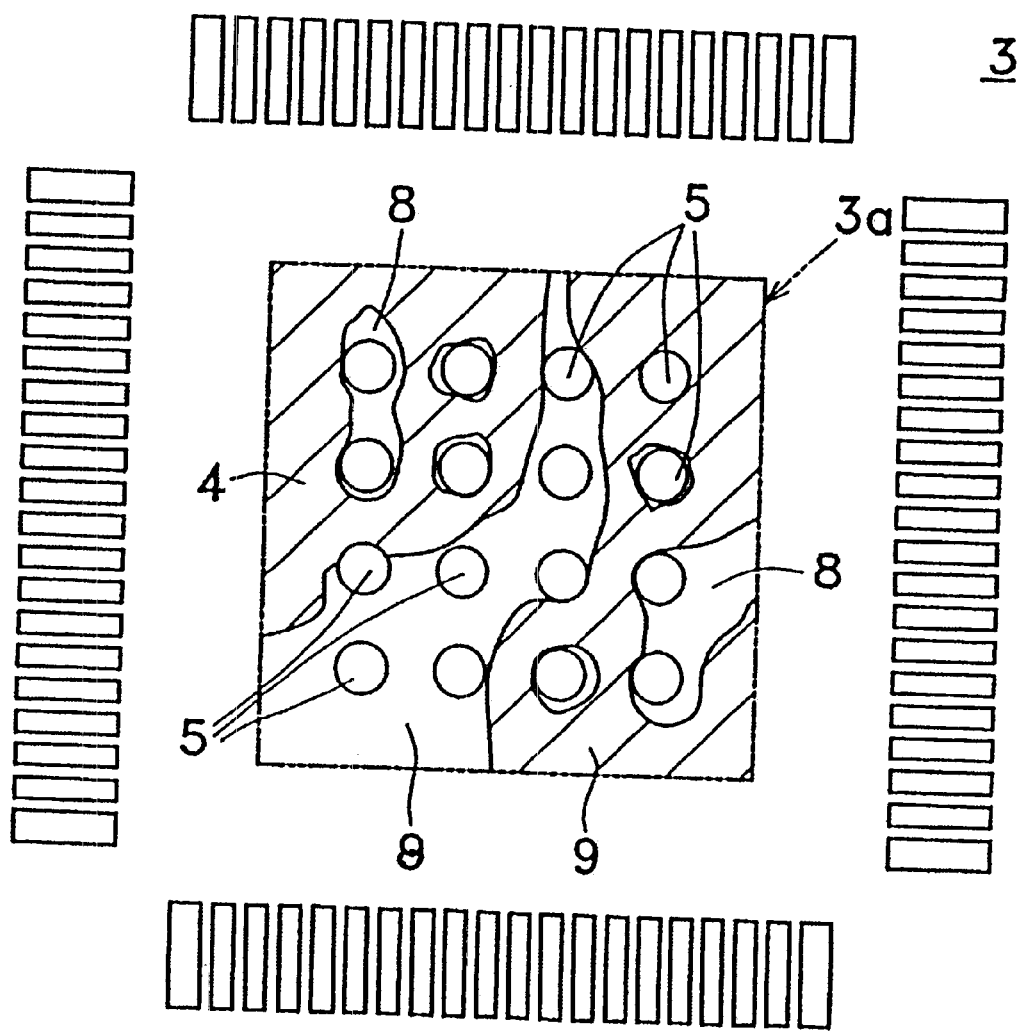
FIG. 12 is an enlarged plan view showing a problem of a conventional printed wiring board.

Ten known printed wiring boards of the type shown in FIG. 12, which have through holes formed through a heat transfer surface comprising a copper layer, were tested. First, solder paste was screen printed on the whole surfaces of the respective heat transfer surfaces, and then it was reflowed by a conventional method to mount electronic components thereon. The resulting packages were inspected with X rays to check the bonding condition of the heat transfer surfaces thereof. The results of these inspections were that the percentage of the solder-applied area to the area of the heat transfer surface varied widely, due to solder leakage into one or more through holes. The range of this percentage varied from about 20 to 80 percent of the total area of the respective heat transfer surface. An average percentage worked out to be about 34 percent. It was further determined that even if there was no leakage of solder into the through holes, the maximum percentage of the solder-applied area would be about 80 percent of the total heat transfer surface.

Ten printed wiring boards of the type shown in FIG. 1, which had through holes formed through the heat transfer surfaces comprised of copper layers were tested. Solder resist was applied to the respective heat transfer surfaces to form the aforedefined separate areas. Solder paste was screen printed on those areas to form solder-applied areas, and then reflowed by a conventional method to mount electronic components thereon. The resulting packages were inspected with X rays to check the bonding condition of the heat transfer surfaces thereof. The results of the inspections showed that the electronic components were soldered onto all the solder-applied areas without leakage of solder paste to the board's through holes. The effective percentage of the solder-applied areas was about 48 percent.

Figure 10:
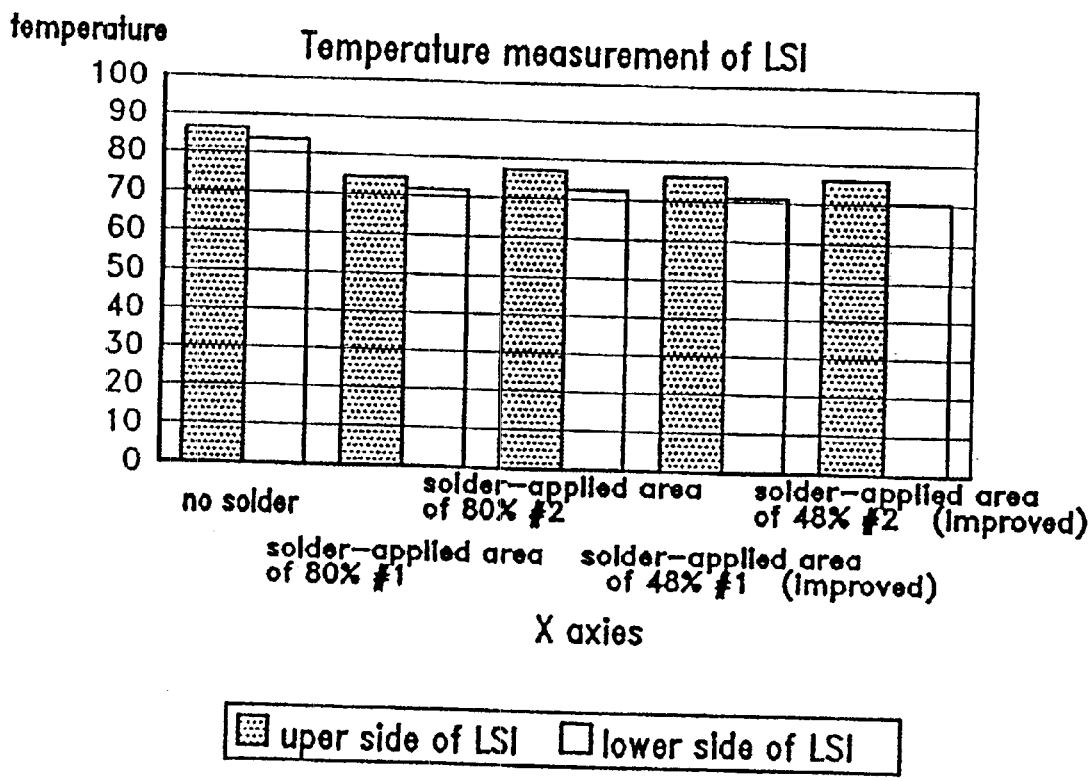
FIG. 10 is a bar chart providing a comparison of heat dissipation properties between packages of the present invention and conventional packages.
Figure 11:
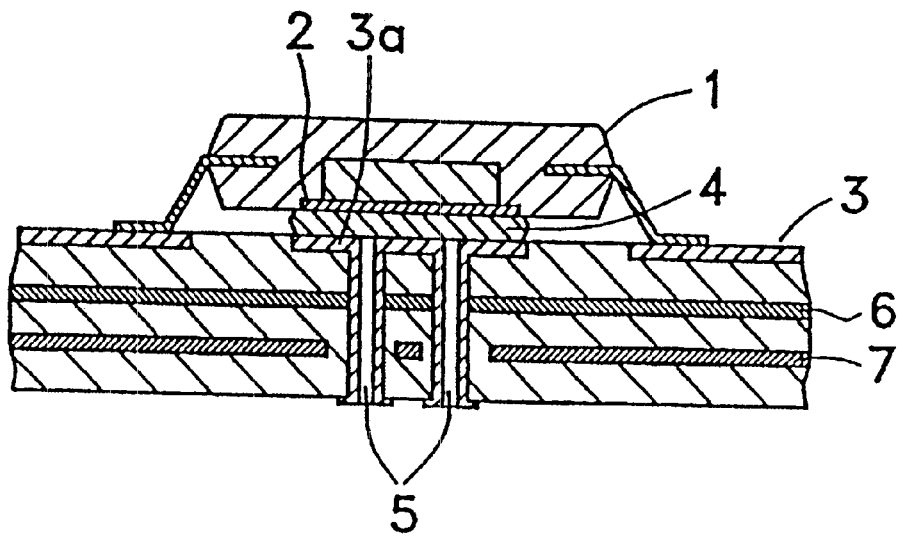
FIG. 11 is an enlarged, side view of a conventional printed wiring board with an electronic component mounted thereon.

In order to compare the heat dissipation effects between various packages, temperatures of the upper side and the lower side of the mounting components were measured. See FIG. 10. In these measurements, five sample packages were tested: (1) two (#1, #2) of the conventional type having a total solder-applied area of about 80 percent; (2) one having no solder-applied area;

and (3) two (#1, #2) having a total solder-applied area of about 48 percent, which were two of the improved packages produced in accordance with the invention's teachings. As shown in FIG. 10, there was no significant temperature difference between packages (identified simply as LSIs in FIG. 10) having a total solder-applied area of about 80 percent and the improved packages produced according to the teachings herein wherein a total solder-applied area of about 48 percent resulted. On the contrary, the package (LSI) having no solder-applied area dissipated relatively little heat, so that its temperature was as much as 10 degrees Celsius higher than the other four. Thus, it is clear from these results that packages of the type taught herein, having a total solder-applied area of about 48 percent, provide comparable heat transfer to packages having about 80 percent solder-applied areas. Again, it is worth mentioning that packages having the resulting 80 percent areas occur when solder does not intrude into the open regions (having through holes) therein, an ideal situation. A lesser total area will obviously result if such intrusion occurs.

While there have been shown and described what are at present the preferred embodiments of the invention, it will be obvious to those skilled in the art that various changes and modifications may be made therein without departing from the scope of the invention as defined by the appended claims.

What is claimed is:

1. An electronic package comprising:
    a printed wiring board including at least one internal conductive layer;
    an electronic component mounted on said printed wiring board and including a heat dissipating surface; and
    a heat transfer surface located on said printed wiring board and positioned directly beneath said electronic component for receiving heat generated by said electronic component, said heat transfer surface being thermally bonded to said heat dissipating surface and including a plurality of solder-applied areas spaced separately from one another on said heat transfer surface, said heat transfer surface further including a plurality of through holes therein, at least one of said through holes being thermally coupled to said at least one internal conductive layer such that said internal conductive layer will provide a path for heat transfer during package operation.

2. The electronic package according to claim 1 further including a solder resist dam positioned on said printed wiring board and having a width sufficiently wide enough to prevent molten solder from flowing from one solder-applied area to another on said heat transfer surface.

3. The electronic package according to claim 1 further including a solder resist dam positioned on said printed wiring board and having a width sufficiently wide enough to prevent molten solder from flowing from one or more of said solder-applied areas into at least one of said through holes within said heat transfer surface of said printed wiring board.

4. The electronic package according to claim 1 wherein said plurality of through holes are positioned in an interspersed pattern among said solder-applied areas.

5. An electronic package comprising:
    a printed wiring board;
    an electronic component mounted on said printed wiring board and including a heat dissipating surface; and
    a heat transfer surface located on said printed wiring board and positioned directly beneath said electronic component for receiving heat generated by said electronic component, said heat transfer surface being thermally bonded to said heat dissipating surface and including a plurality of solder-applied areas arranged in a pattern and spaced separately from one another on said heat transfer surface, some of said solder-applied areas being larger in area than others of said solder-applied areas.

6. The electronic package according to claim 5 further including a solder resist dam positioned on said printed wiring board and having a width sufficiently wide enough to prevent molten solder from flowing from one solder-applied area to another on said heat transfer surface.

7. The electronic package according to claim 5 wherein the larger of said solder-applied areas are located along the sides of said pattern.

8. The electronic package according to claim 5 wherein the larger of said solder-applied areas are located at the corners of said pattern.

9. The electronic package according to claim 5 further including a plurality of through holes located within said printed wiring board for dissipating heat from said electronic component externally of said printed wiring board.

10. The electronic package according to claim 9 further including a solder resist dam positioned on said printed wiring board and having a width sufficiently wide enough to prevent molten solder from flowing from one or more of said solder-applied areas into at least one of said through holes within said heat transfer surface of said printed wiring board.

11. The electronic package according to claim 9 wherein said plurality of through holes are positioned in an interspersed pattern among said solder-applied areas.

12. An electronic package comprising:
    a printed wiring board;
    an electronic component mounted on said printed wiring board and including a heat dissipating surface;
    a heat transfer surface located on said printed wiring board and positioned directly beneath said electronic component for receiving heat generated by said electronic
    component, said heat transfer surface being thermally bonded to said heat dissipating surface and including a plurality of solder-applied areas spaced separately from one another on said heat transfer surface; and
    a solder resist dam positioned on said printed wiring board and having a width sufficiently wide enough to prevent molten solder from flowing from one solder-applied area to another on said heat transfer surface.

13. The electronic package according to claim 12, further including a plurality of through holes located within said printed wiring board for dissipating heat from said electronic component externally of said printed wiring board.

14. The electronic package according to claim 13, wherein said solder resist dam positioned on said printed wiring board also prevents molten solder from flowing from one or more of said solder-applied areas into at least one of said through holes within said heat transfer surface of said printed wiring board.

15. The electronic package according to claim 13 wherein said plurality of through holes are positioned in an interspersed pattern among said solder-applied areas.

* * * * *